United States Patent
Wilson et al.

(10) Patent No.: US 6,903,554 B2
(45) Date of Patent: Jun. 7, 2005

(54) CONTROL OF RELAY OPENING EVENTS

(75) Inventors: James Douglas Wilson, Benton, AR (US); Jason Shain Breland, Conway, AR (US)

(73) Assignee: Carrier Corporation, Farmington, CT (US)

( * ) Notice: Subject to any disclaimer, the term of this patent is extended or adjusted under 35 U.S.C. 154(b) by 0 days.

(21) Appl. No.: 10/619,810

(22) Filed: Jul. 15, 2003

(65) Prior Publication Data

US 2005/0012505 A1 Jan. 20, 2005

(51) Int. Cl.$^7$ .............................................. G01R 31/02
(52) U.S. Cl. ...................................... 324/418; 361/160
(58) Field of Search ........................... 324/418; 361/160

(56) References Cited

U.S. PATENT DOCUMENTS

| | | | |
|---|---|---|---|
| 4,321,946 A | | 3/1982 | Paulos et al. |
| 4,360,847 A | | 11/1982 | Bloomer et al. |
| 5,390,231 A | * | 2/1995 | Hung et al. ................ 379/2 |
| 5,530,615 A | | 6/1996 | Miller et al. |
| 6,233,132 B1 | * | 5/2001 | Jenski ...................... 361/160 |
| 6,768,615 B2 | * | 7/2004 | Liu .......................... 361/2 |

FOREIGN PATENT DOCUMENTS

| | | | | |
|---|---|---|---|---|
| CA | 2281362 A1 | * | 3/2000 | ............ H01H/9/00 |
| JP | 08114634 A | * | 5/1996 | ............ G01R/27/14 |

* cited by examiner

Primary Examiner—Charles H. Nolan, Jr.
(74) Attorney, Agent, or Firm—Wall Marjama & Bilinski LLP

(57) ABSTRACT

An apparatus for measuring an operating parameter of a relay armature operating a pair of relay contacts, and for controlling the voltage that occurs between the pair of relay contacts when they open or close. The apparatus includes a microcontroller that senses a reference voltage, and a sensed voltage signal that comprises a voltage component representing a relay coil voltage, a power supply voltage component, and a voltage component induced by a motion of the armature. The microcontroller uses discrete digital samples of the signals to deduce the operating parameter. The microcontroller provides a control signal to cause the relay to open or close the relay contacts at a time when a predefined voltage occurs therebetween. The predefined voltage can be substantially zero volts. Methods of use of the apparatus to control the opening and closing of relay contacts are described.

16 Claims, 3 Drawing Sheets

CONTROL OF RELAY OPENING EVENTS

FIELD OF THE INVENTION

The invention relates to signal analysis methods in general and particularly to a system that employs signal analysis to control the timing of switchgear.

BACKGROUND OF THE INVENTION

Relays used for switching suffer degradation caused by sparks created upon opening relays that are carrying current. The sparks cause erosion of the switch contacts, which damages the contacts over time. In addition, sparks may present other potentially dangerous conditions, especially if used in environments where combustible or explosive gases are present. One solution to the problem of spark generation is to open relay contacts at the time when the voltage applied to the contacts is zero volts, or so-called switching at zero crossing using zero-crossing detection circuits as described in U.S. Pat. No. 4,360,847, entitled "Diode Assisted Relay Contactor," issued on Nov. 23, 1982 to Bloomer et al.

U.S. Pat. No. 5,530,615, entitled "Method and apparatus for enhancing relay life," issued on Jun. 25, 1996, to Miller et al., describes opening or closing the contacts of a relay used in a furnace control system or a gas valve solenoid at or shortly before a zero crossing (e.g., zero voltage across the contacts) by measuring a relay mechanical time constant parameter and using this parameter to set fixed time delays for relay activation.

U.S. Pat. No. 4,321,946, entitled "Armature position monitoring and control device," issued on Mar. 30, 1982 to Paulos et al., describes apparatus and methods for detecting the movement of the armature of a solenoid by monitoring the backward electromotive force (back EMF) induced in the solenoid coil by the movement of the armature while exposed to the residual field magnetic field of the solenoid coil. A first derivative of a current passing through the solenoid is used to identify the time when the back EMF is generated.

U.S. Pat. No. 6,233,132, entitled "Zero cross relay actuation method and system implementing same," issued on May 15, 2001 to Jenski (hereinafter "the Jenski patent") describes apparatus and methods operating relay contacts under zero crossing conditions by detecting slope changes in coil voltage and current. Jenski's method requires that a resistor be placed in parallel with the relay coil. Then upon de-energizing the relay coil a "unique" voltage appears, as presented by Jenski at FIG. 2, that may be used to predict the instant of contact opening. The instant of contact opening is found by means of detecting a change in slope for the voltage waveform shown in FIG. 2. In practice, the contacts usually open sometime after the point in time indicated by Jenski, dependent upon relay design. Jenski's method requires a simple slope detector circuit for proper operation. The system records the history of a particular relay, including turn on and turn off times as functions of both positive-going and negative-going portions of sine wave excitations, and uses the historical data to calculate when to actuate the relay contacts.

There is a need for apparatus and methods that will provide accurate timing to control the actuation of relays contacts at a time selected to provide zero voltage switching (or alternatively, switching at a selected voltage) of the relay which is simple and inexpensive to implement and which improves the long term performance of the contacts relative to presently available technology.

SUMMARY OF THE INVENTION

In one aspect, the invention relates to an apparatus for measuring an operating parameter of a relay armature operating a pair of relay contacts. The apparatus comprises a relay comprising at least two contacts, an armature controlling at least one of the contacts, and a solenoid coil having first and second terminals, the solenoid coil configured to move the armature in response to a control signal to cause the contacts to assume a condition selected from an open condition and a closed condition. The apparatus additionally comprises a voltage source connected to the first terminal of the solenoid coil, the voltage source further configured to provide a reference voltage signal, and a voltage sensor having a first terminal connected to the second terminal of the solenoid coil, a second terminal configured to receive a second reference voltage, and a third terminal configured to provide a sensed voltage signal. The apparatus also comprises a microprocessor-based programmable controller module comprising at least one analog-to-digital converter, the controller module configured to actuate the relay by providing the control signal to the relay, the controller module configured to receive the reference voltage signal and the sensed voltage signal, the controller module configured to use the at least one analog-to-digital converter to convert the reference voltage signal and the sensed voltage signal into respective discrete time sampled digital signals, the controller module configured to analyze the respective discrete time sampled digital signals. The apparatus measures an operating parameter of the relay when the relay changes the condition of the relay contacts.

In one embodiment, the sensed voltage signal comprises a voltage component representing a relay coil voltage, a power supply voltage component, and a voltage component induced by a motion of the armature.

In one embodiment, the controller module is further configured to cause the relay to change the condition of the relay contacts at a time when a predefined voltage occurs therebetween. In one embodiment, the predefined voltage is substantially zero volts.

In one embodiment, the apparatus further comprises a computer program recorded on a computer-readable medium, the computer program when operating on the controller module causing the relay to change the condition of the relay contacts at a time when a substantially predefined voltage will occur therebetween.

In one embodiment, the operating parameter of the relay when operating the plurality of relay contacts to change the condition of the relay contacts is measured in real time. In one embodiment, the operating parameter of the relay when operating the plurality of relay contacts to change the condition of the relay contacts is measured with a precision of substantially 200 microseconds or less.

In another aspect, the invention features a method of controlling an operation of a relay having a plurality of relay contacts, a relay coil and an armature. The relay is powered by a power supply. The method comprises the steps of measuring a voltage signal across a relay coil as a first time sampled signal, the voltage signal comprising a relay coil voltage component, a power supply voltage component, and a voltage component induced by a motion of the armature; measuring a reference voltage signal as a second time sampled signal; analyzing the respective time sampled signals to measure an operating parameter of the relay; and activating the relay according to the operating parameter so as to cause a change in a condition of the relay contacts selected from an open condition and a closed condition at a time when a selected one of a predefined voltage and a predefined current occurs therebetween.

In one embodiment, the predefined voltage is substantially zero volts. In one embodiment, the predefined current is substantially zero amperes. In one embodiment, a step of the method is performed under the control of a controller module programmed with a computer program. In one embodiment, a selected one of the first sampled time signal and the second sample time signal is measured in real time. In one embodiment, the operating parameter of the relay is measured with a precision of substantially 200 microseconds or less. In one embodiment, the operating parameter of the relay is measured in real time to within a desired angular precision of 30 degrees in phase.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

Figure 1:
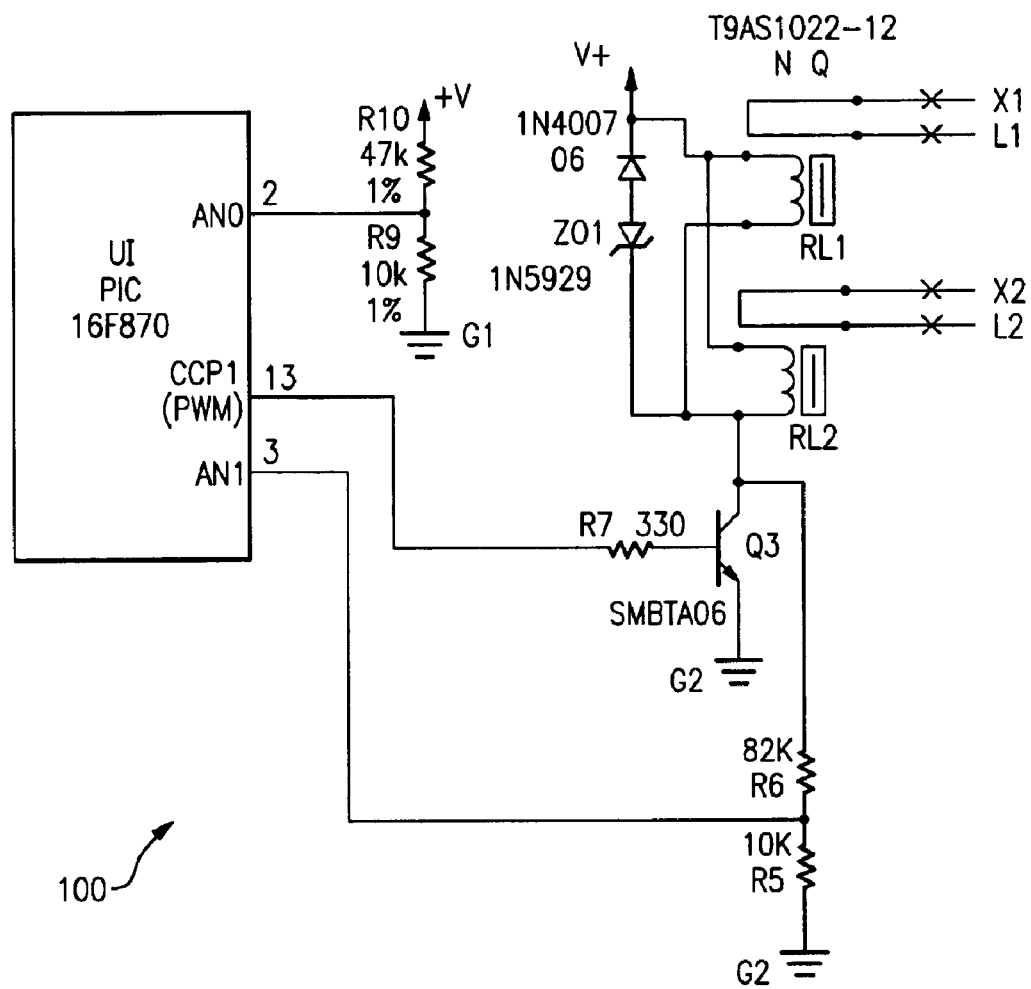
FIG. 1 illustrates a circuit diagram of an embodiment of the invention.

Relay contacts can be damaged by arcs that form when the contacts are opened or closed. For example, as is known from the field of arc welding, low voltage arcs that carry large currents can melt surfaces, and in extreme instances can weld two surfaces together. The life of relay contacts can be extended by control of the current, or in some instances, the voltage, that appears when the relay contacts open or close, particularly by controlling the relevant variable to have a small value. Depending on the impedance of a load present in a circuit controlled by the relay contacts, the phase angle of the current and the voltage that appear at the relay contacts can vary. For resistive loads, the current and voltage tend to be in phase, while for inductive or capacitive loads, the phase angle can tend toward 90 degrees or π/2 radians. For example, for an inductive load such as a motor, the zero crossing of the current through the motor is used, and is more important than the zero crossing of the line voltage. As may be seen by the well-known relations for voltage as a function of current, in an inductor voltage V=Inductance L times the derivative of current di/dt, and so voltage leads current. By comparison in an inductor, V=the integral of current divided by capacitance C, and so voltage lags current. In general, the total impedance of the load attached to the relay contacts determines the current/voltage phase relationship.

The invention provides apparatus and methods for predicting with high accuracy the instant of contact opening for relays for the purpose of improving a relay's useful working life. A predictive solution allows the control of the relay contacts is useful in particular for extending the useful life of a relay used to switch high current A.C. loads.

The voltages that appear across the coil of a relay are in fact two voltages added together, one voltage term being a exponential decay plus a constant, and a second term being a voltage generated by the movement of an armature of a relay. Since the form of the exponential is known (or the parameters that describe the exponential term can be deduced), it may be subtracted from the observed voltage, leaving only the voltage produced by the movement of the armature. Subtraction also removes the effect of the constant term. This second voltage, representing the motion of the armature of the relay, may be analyzed to determine the instant of contact opening. The mathematical operations that are required are explained in greater detail below, and can be implemented using standard circuit hardware and computer software, as will be understood by those of ordinary skill in the circuit and computer programming arts. In one embodiment, a circuit and a computer program operating on a microprocessor have been implemented according to principles of the invention. The circuit and computer program separate the aforementioned voltages in real time. The circuit and computer program estimate the instant of relay contact opening using the armature voltage term. The system predicts the instant of relay contact opening to within 200 microseconds as measured using 5 different relays. The system controls the operation of the relay, providing relay contact opening and/or closing timing so as to minimize sparking and the associated ill effects. Further, the system also works effectively when two relay coils are wired in parallel. In summary, the systems and methods of the invention provide solutions for analyzing the behavior of the actuation of relay contacts and methods and apparatus for controlling such actuation in real time so as to cause the contacts to open (or to close) at a time when the voltage that appears therebetween is substantially equal to a predefined value, which may be selected in some embodiments as zero volts.

The expected improvement in working life of relay contacts operated in accordance with principles of the invention is in the range of 100-fold or more. With a predictive solution of the time of actuation of a relay contact, it is possible to open the relay contacts just before the zero-crossing point of the load current so that contact arcing (and hence contact erosion) is minimized without the necessity to actually measure the load current.

Turning to FIG. 1, a circuit diagram 100 of an embodiment of the invention is shown and its operation explained.

A microcontroller U1 is connected by way of terminal CCP1 to the base of a transistor Q3 by way of a resistor R7. The control signal provided by microcontroller U1 at terminal CCP1 is a pulse width modulated (PWM) signal in one embodiment. Microcontroller U1 activates and deactivates a relay coil of relay RL1 and a relay coil of relay RL2 by means of transistor Q3 in response to one or more of a command from an external source, such as a person, a command generated by a computer program operating thereon, or a command generated by a program operating on a computer in communication with microcontroller U1. The microcontroller U1 shown in the embodiment is a PIC 16F870, available from Microchip Technology of Chandler, Ariz. Other microcontrollers, such as the AT90C8534 microcontroller manufactured by Atmel Corp. of San Jose, Calif., or the 68HC05B6 manufactured by Motorola Inc. of Schaumburg, Ill., or equivalents thereof, can be substituted for microcontroller U1. In some embodiments, a microprocessor-based programmable controller module comprises the microcontroller U1 and one or more other circuit components, such as the one or more A/D converters. In the embodiment shown, transistor Q3 is a SMBTA06, available from Siemens of Munich, Federal Republic of Germany. In the embodiment shown, two relays are shown operated with coils in parallel (model number T9AS1D22-12, available from Tyco Electronics—P&B of Winston-Salem, N.C. having one normally open contact). The number of relays to be controlled is not of particular importance, and in different embodiments can be one or more relays. The contacts of relays RL1 and RL2 may be connected between a line source L1, L2 and a respective load X1, X2. The relays RL1 and RL2 have a diode D6, which in the present embodiment is a 1N4007 diode, and a Zener diode ZD1, which in the present embodiment is a 1N5929 Zener diode, connected across the terminals of each solenoid coil of RL1 and RL1 in order to suppress high voltages that appear across the solenoid coils when the coil current is turned off by operation of transistor Q3.

For purposes of timing, the microcontroller U1 is given a logic level signal which is synchronized to the zero crossing of the line voltage that is supplied to the apparatus. The source of line voltage is not shown, but can be any conventional source of alternating voltage and current, e.g., a wall outlet or the like. For the purpose of exposition, a cycle of operation of a relay is understood as an opening and a closing of the relay contacts, in any order. Using one or more cycles of operation of a relay to be controlled, a time delay parameter, T1, is computed based on measurements of the behavior of the relay during the one or more cycles of operation. In order to implement a method of the invention, microcontroller U1 will sense a zero crossing of the line voltage, wait a time T1, and then deactivate the relay coil. In one embodiment, T1 is computed so that the relay contacts will open just before the next zero crossing. In some embodiments, it is useful to cause the relay contacts to open (or close) with alternating current or voltage sense on each successive activation. In other words, if one is using current as the control parameter, one could cause the relay contact to be opened on a positive-going current crossing of zero on a first activation, and to be opened on a negative-going current crossing of zero an the next activation, whatever the voltage might be at the time of activation of the relay contacts. By alternating zero-crossings on each activation, one can expect to minimize the migration of metal from a contact surface on one contact of a pair of contacts to an opposing contact surface on the other contact of a pair of contacts. Such alteration of sense of a current or a voltage can be accomplished with a deliberate advance or delay of an activation (e.g., a change of an expected duration of "on" or "off") by one half cycle at most. At 60 Hz, one cycle is 1/60th of a second or 0.167 milliseconds, and a half-cycle is thus 0.083 milliseconds. For many applications, such as turning on or off a heating or air conditioning system in a building, such a delay is tolerable. In the case where high AC currents are switched, the magnetic field in the relay core can be influenced by the oscillatory magnetic field produced by the AC load current. Since this perturbation is synchronized to the line voltage, a relay may require more or less time to deactivate dependent upon the polarity of the line voltage and the relative direction, magnitude, and phase of the load current. In such cases, the timing parameter, T1, as described above may be independently computed for each half cycle of the line voltage.

In other embodiments, the relay is actuated so that the contacts will open (or close) at a specific voltage, corresponding to a defined time relative to a zero crossing time for a sinusoidal voltage signal of known amplitude. Further, at the instant the relay coil is de-energized, microcontroller U1 records the voltage on the relay coil by means of a voltage divider comprising resistors R5, R6 connected to an internal analog-to-digital (A/D) unit having an input terminal AN1 of microcontroller U1. The supply voltage is measured by means of a voltage divider comprising resistors R9, R10 and an A/D unit having an input terminal AN0 of microcontroller U1. The data representing the coil voltage is analyzed to improve an estimate of release point T1 so that the relay contacts can be triggered to open just before a zero crossing of the line voltage. In the circuit shown, one or two relays may be used.

The relay voltage is modeled as the sum of three voltage components, one from the relay coil, one from the power supply, and one induced by motion of the armature, as will be understood using the well-known principle of superposition. While the voltages are continuous functions of time, the discrete (or sampled) voltages measured by the A/D has the form shown below in Eq. 1:

$$V_{relay}(n) = \{Vdc + A \exp((Ns-n)/Tr)\} + Va(n) \qquad \text{(Eq. 1)}$$

In the embodiment shown, A is a constant (A=87), Ns is a constant (Ns=2), n (or N) is the sample number, Tr is a constant (Tr=14), Vdc is the measured power supply voltage, and Va(n) is the true waveform produced by the moving armature. The exponential term is due to the collapsing magnetic field in the relay coil after Q3 is switched off.

In operation, $V_{relay}(n)$ is sampled at a fixed interval of time. The terms A, Ns and Tr are selected to match the model of relay. For fine control, the values of A, Ns and Tr may be fit to an individual relay. The value of A defines the amplitude of the exponential, Tr is a time constant and expands or compresses the exponential function in time, and Ns is a variable that serves to shift the exponential right or left on the time axis. Ns is required because the decay of the relay coil voltage may be delayed by either a snubber circuit or the deactivation time of the switching electronics. Further, the representation described above is a first approximation to the voltage decay of the relay coil and may be refined by including second (and/or higher) order terms. The Vdc term depends upon circuit design and the AC line voltage. The function Va(n) depends upon relay design and variations caused by wear and aging.

The exponential function can be generated using software and a programmable computer to calculate a digital signal. As required, the digital signal is applied to a digital to analog converter to generate an analog signal. The exponential function may also be produced by means of combination of resistor and capacitor driven by a voltage step function. The resistor-capacitor product, or RC time constant, should be matched to the characteristics of the relay. By means of a subtraction circuit, the exponential from the resistor and capacitor may be used to cancel the exponential term in equation 1. In some embodiments, the exponential signal generated using an RC time constant circuit is converted to a digital signal by use of an analog to digital converter. The subtraction of a generated exponential from $V_{relay}(n)$ can be done either as digital signal or as analog signals. The result would be Va(n) which may be differentiated to find the peak, or a voltage comparator may be used to detect the position and duration of the voltage pulse Va(n). A timer, such as a real time clock, a pulse counter with an oscillator, or any other convenient timing device, is employed and adjusted accordingly to facilitate the zero crossing timing.

In the simplest implementation, the values of A, Ns, and Tr can be determined experimentally and will vary slightly from one relay to another of the same design, but not to the extent that Va(n) will be corrupted. However, the exponential term may be solved for by analyzing $V_{relay}(n)$ in the time period before Va(n) takes non-zero values. Therefore, Eq. 1 can be fit to each relay, independent of relay design. Further, the method can be used on any line frequency commonly in use, 50 Hz, 60 Hz, and 400 Hz.

Figure 2:
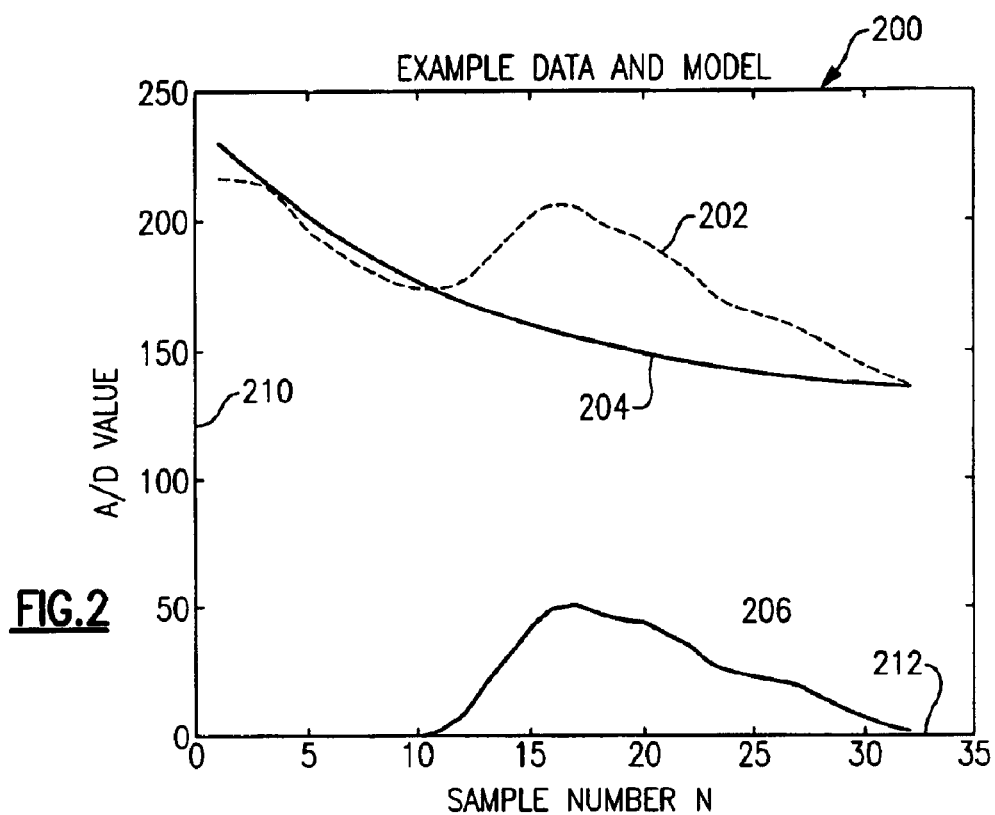
FIG. 2 is a diagram presenting a plot of voltage curves against sample number, which data has been recorded from a circuit operating according to principles of the invention.

Turning to FIG. 2, a diagram 200 presenting a plot of voltage curves, using voltage along the vertical axis 210, against sample number, which corresponds to discrete time segments, along the horizontal axis 212. The sampled data includes $V_{relay}(n)$, which is represented by the curve 202, the term {Vdc+A exp((Ns−n)/Tr)} is represented by the curve 204, and Va(n) is represented by the curve 206. One notes that the value of Va(n) is close to zero at small values of n, e.g., when the armature has been left undisturbed for some time. In FIG. 2 there can be a portion of curve 202 that precedes the portion shown in the FIG. in which the voltage is a constant. In the circuit of FIG. 1, the snubber comprising diode D6 and the Zener diode ZD1 serves to limit the duration of the flat portion of curve 202. The action of the snubbing circuit on the coil is seen in the first few samples of curve 202 where the curve is flat. This portion of curve 202 is excluded from any analysis because a non-linear circuit is active. Further, the design of a snubber circuit should be such that Va(n) is not suppressed.

As will be understood, by subtracting the term {Vdc+A exp((Ns−n)/Tr)} from the sum $V_{relay}(n)$, the value of Va(n) can be measured. This is apparent from rearranging Eq. 1 as shown in Eq. 2.

$$V_{relay}(n) - \{Vdc+A \exp((Ns-n)/Tr)\} = Va(n) \qquad \text{(Eq. 2)}$$

As indicated above, for small n, Va(n) is substantially zero. Also, Vdc is a constant, and is readily determined, if necessary by measurement. If an analytical method involves derivatives of any order, the constant term will disappear, because a derivative of a constant is zero. In discrete analysis, subtracting successive values (or any two values) will remove a constant. The parameters of the exponential term can be deduced as follows. When Ns−n=0, e.g., Ns=2=n, the value of the exponential term is simply A, because exp(0)=1. At n=2, the value of $V_{relay}(2)$=Vdc+A. Then, at any known value of n greater than 2, the difference between $V_{relay}(n) - V_{relay}(2) = \{Vdc+A \exp((Ns-n)/Tr)\} - \{Vdc+A\} = A[\exp((Ns-n)/Tr)-1]$. Since A, Ns and n are known, the measured difference allows the determination of Tr. The model equation is then determined with the exception of the unknown quantity Va(n).

The armature voltage Va(n) can be analyzed by various means to extract the instant the armature moves and hence the instant that the contacts open. In one embodiment, the determination of the position of the peak value of Va(n) is sufficient. Different analytical techniques that can be employed include peak picking using circuitry or software, taking first or higher order derivatives and analyzing the results to locate the peak, and correlation analysis of multiple data values. The peak position indicates the time from deactivation until the instant of relay contact opening. When sampled at 128 microsecond intervals, the typical error in predicting the instant of contact opening was about 200 microseconds worst case. In other embodiments, different sampling intervals are used that depending on the sampling rate of the analog-to digital converter. Many other analytical methods can be applied, limited only by microcontroller resources and the imagination and capability of the analyst. As is well known in the mathematical analysis arts, there are a variety of mathematical techniques that can be applied to the discrete data to extract parametric information.

Figure 3:
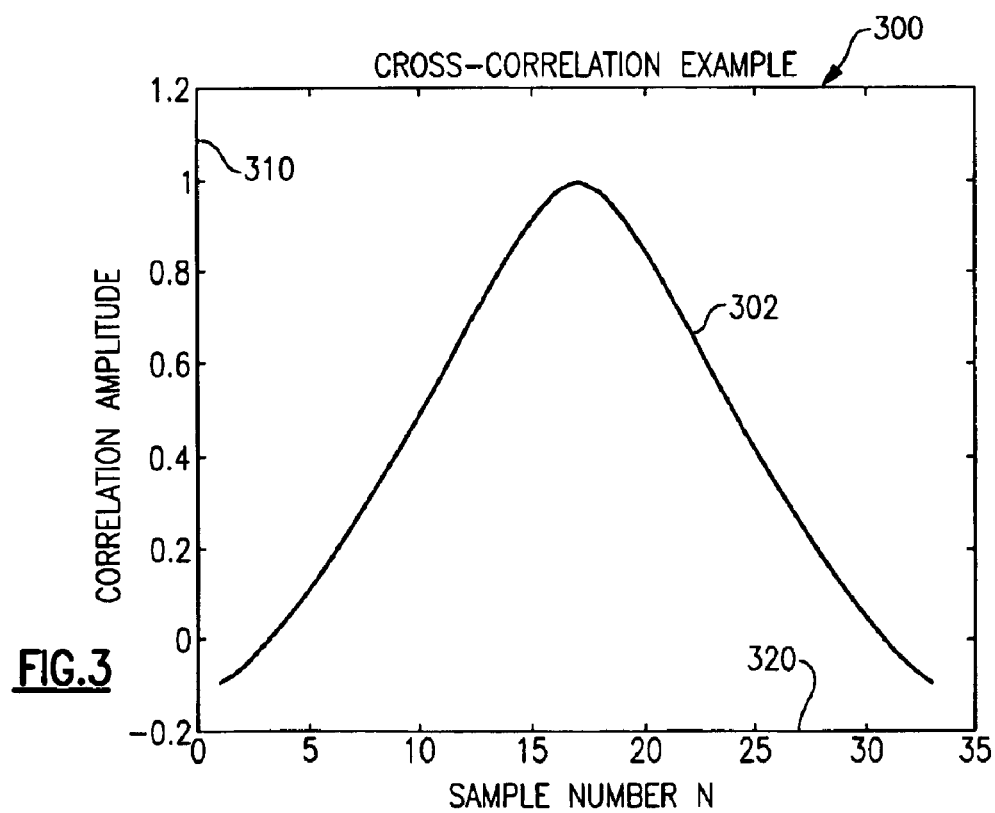
FIG. 3 is a diagram that depicts the results of a cross-correlation calculation of results obtained from a circuit operating according to principles of the invention.

FIG. 3 is a diagram 300 that depicts the results of a cross-correlation calculation for Va(n). The curve 302 represents the correlation value, plotted along the vertical axis 310 as a function of sample number N plotted along the horizontal axis 320. Cross-correlation is a measure of how well two patterns match and at what instant in time they best coincide. Correlation methods are known to reject noise and can yield an accurate measure of time delay in the presence of noise. The cross correlation cannot be performed without subtracting the exponential term. In the present embodiment, the data recorded from an actual relay (the data shown in FIG. 1) may be compared with the inflection point indicated in FIG. 2 of the Jenski patent. The area indicated in the Jenski patent as an inflection point is actually flat (zero slope) for some time in the real recording made under the conditions reported herein. A slope detector can give spurious results during that time, because it may fail to see a slope change, whereas the correlation method is immune to noise and zero slope conditions.

Further, it is believed that one or more relay spring constant(s) can be determined by the shape of the waveform Va(n). For example, a large spring constant would tend to move the armature faster and generate a larger voltage having a narrower pulse width. In some embodiments, observation of the effects of changes in spring constants with time may prove to be a useful diagnostic tool indicating a faulty relay. The method would deduce a spring constant and record the deduced value, which would be compared periodically to a then current measurement of the same constant. A deviation greater than a predetermined value would indicate the onset of a problem with the relay, which potential problem could be communicated to a user or to a maintenance or repair person (e.g., a "perform service soon" warning could be given), or which could be downloaded electronically to a central facility to provide information for a report such as a maintenance report.

Additionally, it is believed that two relay coils placed in parallel may be analyzed to accurately determine the instant of armature movement for each relay even if one relay opens a few milliseconds before another. The present system and method provides measurements at a precision of the order of 100 microseconds, or 0.1 millisecond. When two relay coils are connected in parallel, the Va(n) waveform observed is the simple summation of two very similar voltages, one from each armature. It is believed that a least squares analysis could show when the second relay contacts open, even though the first relay contacts have already opened. Methods taught by the prior art can only give information about the first armature that moves.

Figure 4:
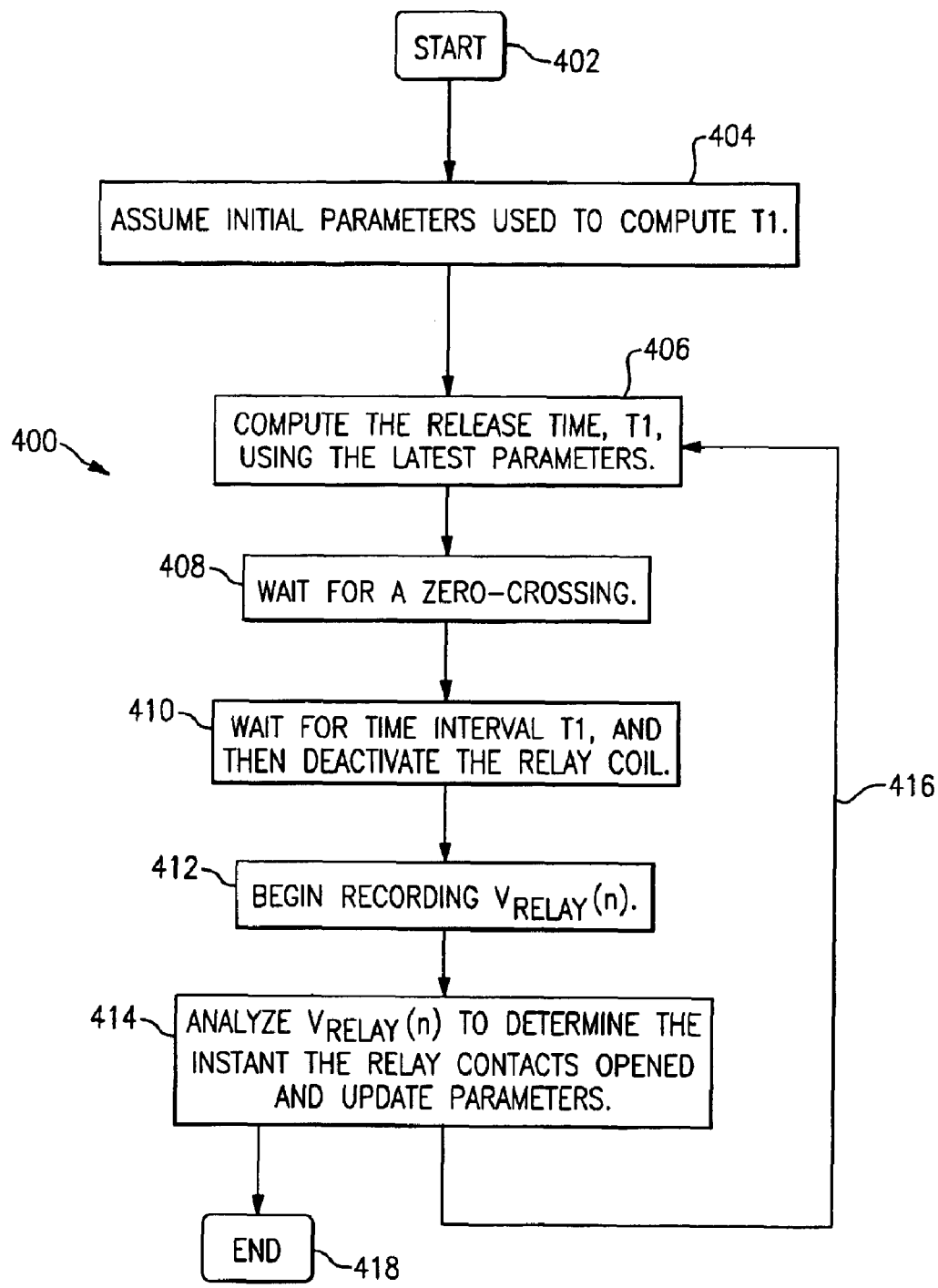
FIG. 4 is a flow diagram that depicts steps in a method of controlling relay contacts, or alternatively, modules that control the operation of relay contacts using a programmable computer, according to principles of the invention.

Turning now to FIG. 4, a flow diagram 400 is shown that indicates the steps in a method of controlling relay contacts, or alternatively, modules that control the operation of relay contacts using a programmable computer.

In the control of relay contacts using a programmable computer, one or more computer software modules perform the task of activating the relay at substantially an exact time so that the relay contacts open at substantially a desired instant. The modules perform at least the following actions. A module initializes the system, as depicted by box 402, to set up the necessary timers, and perform any start-up routines, such as initializing the condition of the relay contacts, and set an initial state of a switch, such as a toggle switch or a TOGGLE flag indicative of a condition of the contacts of a relay.

As indicated at box 404, the programmable computer executes a module to enter the necessary parameters. The parameters can be stored in a memory, either at the programmable computer or at a remote location that the computer can access, or may be entered by a user.

As indicated at box 406 a module operating on the computer calculates a release time, T1, using the most current parameters entered into the computer.

As indicated at box 408, the computer executes a module that causes the computer to wait for a zero crossing. This is performed, for example, by loading a hardware timer with the values used to perform a delay having a duration of the time interval T1, and waiting until a zero crossing is sensed at the relay coil.

As indicated at box 410, the computer executes a module that waits for the computed time interval T1, and then activates the relay coil to change the state of the relay contacts.

As indicated at box 412, data corresponding to $V_{relay}(n)$ is recorded under the control of a module.

As indicated at box 414, a module analyzes the data corresponding to $V_{relay}(n)$. In one embodiment, a module captures the peak position, Np, of the armature movement as discussed above. Np is used to compute a 16 bit value, expressed in microseconds, that is equal to the time difference between the instant the relay is deactivated and the instant the peak occurs in the recorded waveform Va(n). This value is here in referred to as Relay. In the embodiment described, the module toggles the TOGGLE flag which is also used in the calculation of the next T1.

In one embodiment, the computation of T1 in microseconds is carried out as follows:

$$T1=P/2+TOGGLE*(P/2)-Relay-MARK$$

where
P/2 is one half of the period of the AC line,
TOGGLE is either 1, or 0,
Relay is the time required for the relay contacts to open, and
MARK is a constant set by the programmer.

The value for MARK is determined by experiment. However, if MARK is set to zero, then the relay contacts should open at a zero crossing. There is a MARK value for 50 Hz systems and a MARK value for 60 Hz systems. If it is desired to open the relay contacts at 460 microseconds before zero crossing, MARK=460. The parameter TOGGLE is used to alternate the half cycle on which the relay contacts open. In one embodiment, TOGGLE=1 causes activation on a positive-going zero crossing, and TOGGLE=0 causes activation on a negative going zero crossing. A value for the Relay variable may be computed only after the relay is activated. Therefore, an initial value is assumed. In one embodiment, the initial value for the Relay variable is assumed to be 4000 microseconds.

In instances where the operation of the relay contacts continues, the control process travels back to the step or module corresponding to box 406, which is indicated by the arrow labeled 416. When the process is complete, and no further control of the relay contacts is necessary, the process ends at box 418, labeled "END."

Those of ordinary skill will recognize that many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been explained with reference to the structure disclosed herein, it is not confined to the details set forth and this invention is intended to cover any modifications and changes as may come within the scope of the following claims.

What is claimed is:

1. An apparatus for measuring an operating parameter of a relay operating a pair of relay contacts, comprising:
   a relay comprising at least two contacts, an armature controlling at least one of said contacts, and a solenoid coil having first and second terminals, said solenoid coil configured to move said armature in response to a control signal to cause said contacts to assume a condition selected from an open condition and a closed condition;
   a voltage source connected to said first terminal of said solenoid coil, said voltage source further configured to provide a first reference voltage signal;
   a voltage sensor having a first terminal connected to said second terminal of said solenoid coil, a second terminal configured to receive a second reference voltage signal, and a third terminal configured to provide a sensed voltage signal; and
   a microprocessor-based programmable controller module comprising at least one analog-to-digital converter, said controller module configured to actuate said relay by providing said control signal to said relay, said controller module configured to receive a reference voltage signal based on at least one of said first and second reference voltage signals and said sensed voltage signal, said controller module configured to use said at least one analog-to-digital converter to convert said reference voltage signal based on at least one of said first and second reference voltage signals and said sensed voltage signal into respective discrete time sampled digital signals, said controller module configured to analyze said respective discrete time sampled digital signals;
   whereby said apparatus measures an operating parameter of said relay when said relay changes said condition of said relay contacts.

2. An apparatus as recited in claim 1, wherein said sensed voltage signal comprises a voltage component representing a relay coil voltage, a power supply voltage component, and a voltage component induced by a motion of said armature.

3. An apparatus as recited in claim 1, wherein said controller module is further configured to cause said relay to change said condition of said relay contacts at a time when a selected one of a predefined voltage and a predefined current occurs therebetween.

4. An apparatus as recited in claim 3, wherein said predefined voltage is substantially zero volts.

5. An apparatus as recited in claim 3, wherein said predefined current is substantially zero amps.

6. An apparatus as recited in claim 3, wherein said apparatus further comprises a computer program recorded on a computer-readable medium, said computer program when operating on said controller module causing said relay to change said condition of said relay contacts at a time when a substantially predefined voltage will occur therebetween.

7. An apparatus as recited in claim 1, wherein said operating parameter of said relay when operating said plurality of relay contacts to change said condition of said relay contacts is measured in real time.

8. An apparatus as recited in claim 7, wherein said operating parameter of said relay when operating said plurality of relay contacts to change said condition of said relay contacts is measured with a precision of substantially 200 microseconds or less.

9. An apparatus as recited in claim 1, wherein said operating parameter of said relay when operating said plurality of relay contacts to change said condition of said relay contacts is measured in real time to within a desired angular precision of 30 degrees in phase.

10. A method of controlling an operation of a relay having a plurality of relay contacts, a relay coil and an armature, said relay being powered by a power supply, comprising the steps of:

measuring a voltage signal across a relay coil as a first time sampled signal, said voltage signal comprising a relay coil voltage component, a power supply voltage component, and a voltage component induced by a motion of said armature;

measuring a reference voltage signal as a second time sampled signal;

analyzing said respective time sampled signals to measure an operating parameter of said relay; and activating said relay according to said operating parameter so as to cause a change in a condition of said relay contacts selected from an open condition and a closed condition at a time when a selected one of a predefined voltage and a predefined current occurs therebetween.

11. A method as recited in claim 10, wherein said predefined voltage is substantially zero volts.

12. A method as recited in claim 10, wherein said predefined current is substantially zero amps.

13. A method as recited in claim 10, wherein a step of said method is performed under the control of a controller module programmed with a computer program.

14. A method as recited in claim 10, wherein a selected one of said first sampled time signal and said second sample time signal is measured in real time.

15. A method as recited in claim 10, wherein said operating parameter of said relay is measured with a precision of substantially 200 microseconds or less.

16. A method as recited in claim 10, wherein said operating parameter of said relay is measured in real time to within a desired angular precision of 30 degrees in phase.

* * * * *